(12) United States Patent
Miki

(10) Patent No.: US 7,265,634 B2
(45) Date of Patent: Sep. 4, 2007

(54) SYSTEM AND METHOD FOR PHASE-LOCKED LOOP INITIALIZATION

(75) Inventor: Kazuhiko Miki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 11/155,245

(22) Filed: Jun. 17, 2005

(65) Prior Publication Data

US 2006/0284688 A1    Dec. 21, 2006

(51) Int. Cl.
*H03L 7/00* (2006.01)
(52) U.S. Cl. ............... 331/16; 331/1 A; 331/DIG. 2; 327/159
(58) Field of Classification Search ............ 331/1 A, 331/DIG. 2, 159, 16; 327/159
See application file for complete search history.

(56) References Cited

U.S. PATENT DOCUMENTS

| | | | |
|---|---|---|---|
| 4,560,950 A * | 12/1985 | Cabot | 331/1 A |
| 5,257,294 A * | 10/1993 | Pinto et al. | 375/376 |
| 5,512,860 A | 4/1996 | Huscroft et al. | |
| 6,104,251 A * | 8/2000 | Ramey et al. | 331/14 |
| 6,525,612 B2 | 2/2003 | Aoki | |
| 6,563,386 B1 * | 5/2003 | Raghava et al. | 331/1 A |
| 2004/0157576 A1 * | 8/2004 | Adachi et al. | 455/260 |
| 2004/0263146 A1 | 12/2004 | Boerstler et al. | |

FOREIGN PATENT DOCUMENTS

| | | |
|---|---|---|
| JP | 2000-049598 | 2/2000 |
| JP | 2003-069423 | 3/2003 |

* cited by examiner

*Primary Examiner*—Robert Pascal
*Assistant Examiner*—Levi Gannon
(74) *Attorney, Agent, or Firm*—Sprinkle IP Law Group

(57) ABSTRACT

Devices, methods, and systems for initializing a phased-lock loop (PLL) circuit which prevents or reduces the occurrences of voltage-controlled oscillator (VCO) frequency exceeding a divider's maximum input frequency, thus preventing or reducing at least one cause of lock failure. Disclosed is a PLL circuit having logic circuitry configured to hold a PFD reference-signal input low and provide a divided reference-signal to a PFD feedback-signal input while an initialization signal is asserted. The PLL can be initialized without adding circuitry to a VCO input. By asserting an initialization signal, an input voltage to a voltage-controlled oscillator is attenuated. The initialization signal is adapted to gate inputs to and outputs from the phase-locked loop circuit.

25 Claims, 5 Drawing Sheets

SYSTEM AND METHOD FOR PHASE-LOCKED LOOP INITIALIZATION

TECHNICAL FIELD OF THE INVENTION

The present invention relates to initialization techniques for a phase-locked loop (PLL) circuit, and more particularly, to initializing a PLL circuit during a power-on-reset sequence.

BACKGROUND OF THE INVENTION

Phase-locked loops are widely used in digital electronics, signal telemetry, and communications applications. Phase-locked loop (PLL) integrated circuits produce an oscillator frequency output which matches an input frequency signal. Many applications require phase-locked loop (PLL) circuits which will work with high frequencies. Some such applications utilize PLL circuits which are reconfigurable. During a start-up process, high frequency PLL circuits may require indeterminate periods of time to achieve lock and initialize. Some high-frequency PLL circuits may fail to lock entirely. In particular, some high-frequency PLL circuits may have voltage-controlled oscillators (VCOs) with maximum output frequencies which approach or exceed maximum input frequencies of their respective dividers. Such high-frequency PLL circuits may have VCO output frequencies during start-up which are near or above the maximum input frequencies for their respective dividers. Thus, at start-up, some high-frequency PLL circuits may either lock after significant time and effort, or fail to lock entirely. Accordingly, a need exists for improved initialization for high-frequency PLL circuits. Further, a need exists for PLL circuits which may be configured to a steady state during initialization. It is desirable to improve PLL initialization without introducing noise to the PLL circuit.

SUMMARY OF THE INVENTION

Systems and methods for improved phase-locked loop (PLL) initialization are disclosed. These systems and methods may prevent PLL lock failures.

Devices and methods for initializing a phased-lock loop (PLL) circuit are disclosed. The disclosed devices and methods are designed to reduce the incidence of lock failure caused by exceeding a divider's maximum input frequency. Disclosed is a PLL circuit having logic circuitry configured to control inputs to the PLL when an initialization signal is asserted. In an embodiment, the PLL is configured to hold a PFD reference-signal input low and provide a divided reference-signal to a PFD feedback-signal input while the initialization signal is asserted. The PLL can be initialized without adding circuitry to a VCO input. By asserting an initialization signal, an input voltage to a voltage-controlled oscillator is attenuated. The initialization signal is adapted to gate inputs to and outputs from the phase-locked loop circuit.

In an embodiment, a PLL includes a phase-frequency detector, a charge pump, a voltage-controlled oscillator (VCO) providing an oscillation signal, and configuration circuitry. The circuitry acts to control the inputs to the phase-frequency detector when an initialization signal is asserted. Such control includes selecting a signal to be fed back to the PLL through the feedback-signal input to the phase-frequency detector. The PLL may include configuration logic such that default bit values may be used during PLL initialization.

In another embodiment, a phase-locked loop circuit including a first initialization circuit configured to control a reference-signal input of a phase-frequency detector, where the first initialization circuit is gated by the initialization signal. Also included in the embodiment is a feedback circuit inserted into a feedback loop, where the feedback loop provides input to a feedback-signal input to the phase-frequency detector. The feedback circuit is also gated by the initialization signal.

In one embodiment, a method of initializing a phase-locked loop (PLL) circuit which includes controlling the inputs to the phase-locked loop circuit such that an input voltage to a voltage-controlled oscillator is attenuated when an initialization signal is asserted.

Thus, an improved PLL circuit is provided. The PLL circuit is configured to operate normally when an initialization signal is unasserted. However, when the initialization signal is asserted, PFD inputs and feedback input are controlled such that the input voltage to the voltage-controlled oscillator (VCO) becomes minimized. Reducing VCO input results in a VCO output having a reduced frequency. Such a reduced frequency output is less likely to exceed the maximum input frequency of a divider. Thereby, the disclosed PLL circuit provides the advantage of reduced incidence of PLL lock failure due to exceeding the maximum input frequency of the divider.

A technical advantage of the invention is the ability to initialize the PLL circuit without adding circuitry to an input node of the voltage-controlled oscillator (VCO). The input node of a VCO is very sensitive to noise. Therefore, adding circuitry to the input node of a VCO may introduce jitter to the PLL circuit. Thus, the invention provides a method of initializing a PLL without adding noise to the input node of the VCO.

Another technical advantage of the invention is that improved PLL circuits such as those described herein may more quickly achieve lock. Because the PLL output frequencies are reduced to approach their minimum during a power on reset, the PLL does not have to work as hard to lock. Also, configuration bits may be advantageously set to values used exclusively for initialization in order to facilitate initialization. Therefore, the time to lock may be reduced. Further, the time to lock may be known. Because the status of the PLL circuit at each node may be known during or following the POR sequence, the time required for the PLL to achieve lock may be known, calculable, or at least more easily estimated. Thus, PLL applications having critical timing requirements may be improved with the PLL circuit configuration and/or initialization method described by this invention.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. After reading the specification, various substitutions, modifications, additions and rearrangements will become apparent to those skilled in the art from this disclosure which do not depart from the scope of the appended claims.

Figure 1:
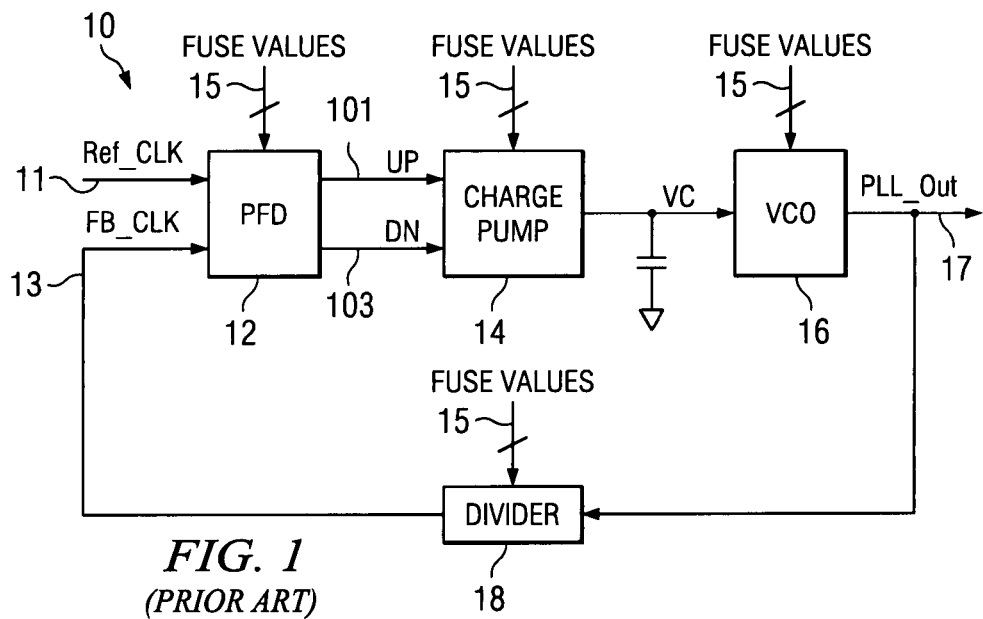
FIG. 1 is a block diagram of a typical phase-locked loop circuit configured to receive fuse values.

FIG. 1 is a block diagram of a typical phase-locked loop (PLL) circuit configured to receive fuse values 15. PLL 10 includes phase-frequency detector (PFD) 12, charge pump 14, and voltage-controlled oscillator (VCO) 16. PFD 12 compares phase and frequency of reference signal, Ref_CLK 11, with phase and frequency of feedback signal, FB_CLK 13. From these comparisons, PFD 12 generates difference signals. These difference signals are positive current source, UP 101, and negative current source, DN 103. UP 101 and DN 103 are provided to charge pump 14, and charge pump 14 generates a charge proportional to these difference signals. This generated charge, labeled VC, is input to VCO 16. VCO 16 generates periodic signal PLL_Out 17 according to input voltage VC. The periodic signal PLL_Out 17 may be interchangeably referred to as either a frequency response or a frequency output. Also, it is noted that PLL_Out 17 is not only output from VCO 16, but also output from PLL 10. Feedback frequency divider 18 divides signal PLL_Out 17 and provides resultant feedback signal FB_CLK 13.

PLL 10 is configured using fuse values 15. Some fuse values 15 can be input to each PLL component (PFD 12, charge pump 14, VCO 16, and divider 18) to configure PLL 10, as shown in FIG. 1. Changing these fuse values 15 will allow, for example, a change in PLL output frequency, PLL_Out 17. As noted above, VCO output frequency and PLL output frequency are one in the same in FIG. 1, namely PLL_Out 17. A wide range of PLL output frequencies may be attained by changing fuse values 15. As another example, changing fuse values 15 can allow reference clock signal 11 to be changed while keeping PLL output frequency, PLL_Out 17, constant. Changing fuse values 15 can allow the PLL circuit to operate correctly in view of, for example, varying input parameters and/or varying output parameters.

Figure 2:
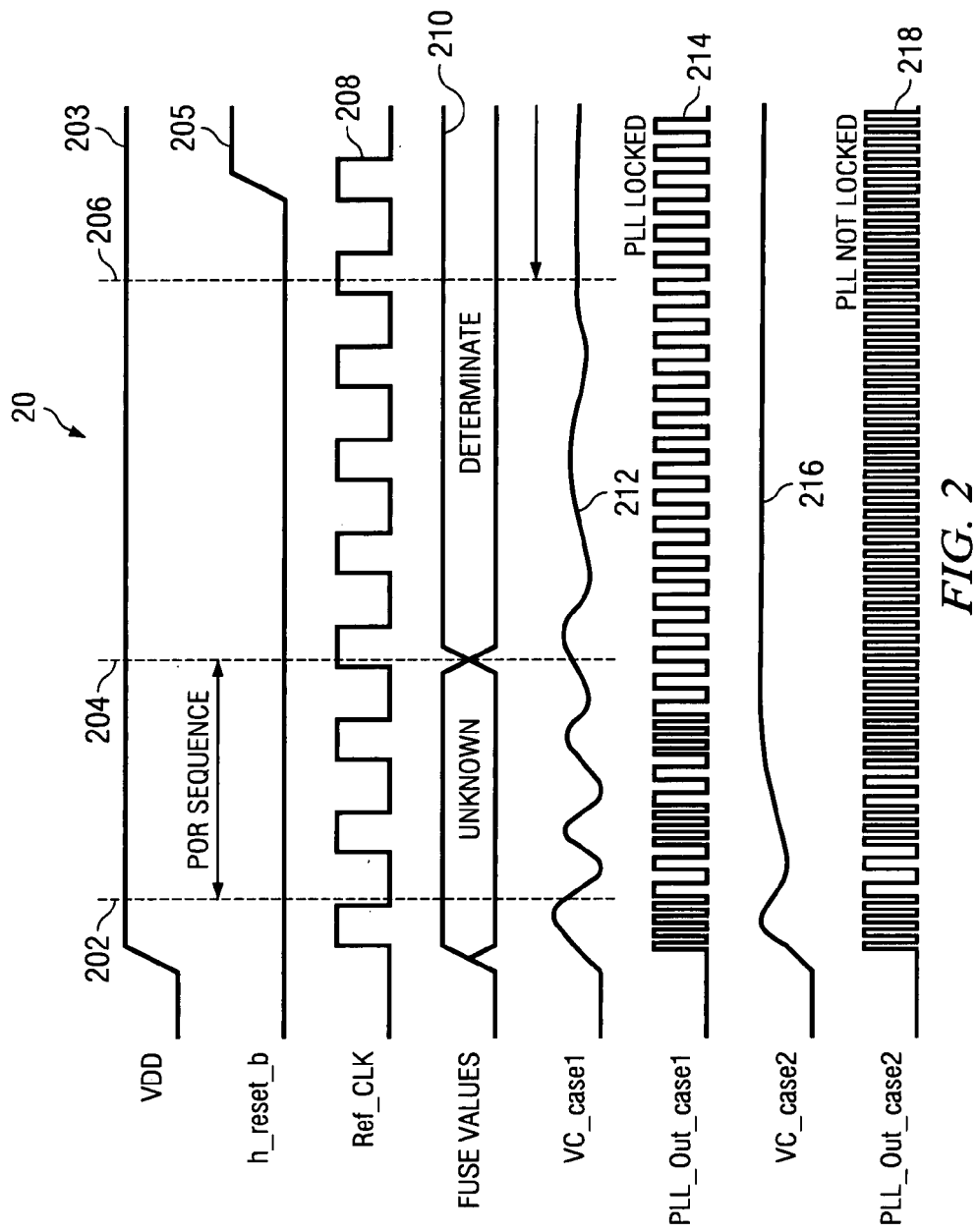
FIG. 2 is a timing diagram for a phase-locked loop circuit such as shown in FIG. 1.

FIG. 2 illustrates timing diagram 20 for a PLL circuit, such as PLL 10 of FIG. 1. Timing diagram 20 illustrates a number of PLL signals and values over a period of time, where the period of time includes power on reset (POR) sequence having a beginning time 202 and an ending time 204. In particular, timing diagram 20 illustrates two POR sequence scenarios. The first scenario illustrates normal PLL operation with PLL lock, and the second scenario illustrates abnormal PLL operation without PLL lock.

The two scenarios can be understood by looking at the respective VCO input voltages and PLL output frequencies. Thus, FIG. 2 does not show every PLL signal for these two POR sequences. The POR sequences' signals and values illustrated in the diagram of FIG. 2 include: power supply voltage VDD 203; hardware reset signal h_reset_b 205; reference clock signal Ref_CLK 208; Fuse Values 210; first scenario VCO input voltage VC_case1 212; first scenario PLL frequency response PLL_Out_case1 214; second scenario VCO input voltage VC_case2 216; and second scenario PLL frequency response PLL_Out_case2 218.

The first power on reset (POR) scenario depicts a phase-locked loop circuit that achieves lock. In contrast, the second POR scenario depicts a phase-locked loop circuit which does not achieve lock. In both scenarios, the phase-locked loop power supply voltage VDD 203 remains high throughout the POR sequence, and the hardware reset signal h_reset_b 205 remains low throughout the POR sequence. Therefore, from at least the beginning of POR sequence at time 202, power supply voltage VDD 203 is high and hardware reset signal h_reset_b 205 is low. VDD 203 remains high and h_reset_b remains low at least until time 206, which is significantly after the POR sequence ends at time 204. As expected, the reference clock signal Ref_CLK 208 maintains stable periodicity throughout. Fuse values 210 are unknown throughout the POR sequence, from at least time 202 and until time 204. However, fuse values 210 become known, or determinate, some time after POR sequence end at time 204.

In the first power on reset (POR) scenario, a phase-locked loop (PLL) circuit that achieves lock is depicted. A PLL does not achieve lock if the maximum input frequency to a PLL's divider is exceeded. Therefore, in the first POR scenario, a maximum input frequency of divider 18 is not exceeded. In the first scenario, VCO 16 provides input directly to divider 18. Therefore, because the PLL achieves lock in the first scenario, it follows that the output frequency of VCO 16, PLL_Out_case1 214, does not exceed the maximum input frequency of divider 18.

The output frequency of VCO 16, PLL_Out_Case1 214, is a function of the input voltage to VCO 16, voltage VC_case1 212. As described above in reference to FIG. 1, charge pump 14 provides input to voltage controlled oscillator 16. Consequently, VC_case1 212 is concurrently the charge pump output voltage as well as the VCO input voltage. As shown in FIG. 2, voltage VC_case1 212 oscillates during the POR sequence (between times 202 and 204). Since voltage VC_case1 212 oscillates during the POR sequence, voltage VC_case1 212 does not go to or near its maximum voltage during the POR sequence. PLL_Out_ case1 does not go to, or near, its maximum frequency during the POR sequence as a result. The maximum input frequency of divider 18 is not exceeded by PLL_Out_case1, and the PLL achieves lock.

PLL output signal PLL_Out_case1 214 achieves lock near time 206, as shown. Fuse values 210 become determinate at some time after the POR sequence end at time 204. Consequently, fuse values 210 are known at time 206 when PLL lock is achieved for the first scenario. Near at time 206, VC_case1 is substantially constant, PLL_Out_case1 has a substantially stable periodicity (having substantially constant amplitude and a substantially constant phase), fuse values are determinate, and PLL 10 is locked.

In the second scenario, voltage VC_case2 216 does not oscillate as significantly during the POR sequence. As described above in reference to FIG. 1, charge pump 14 provides input to voltage controlled oscillator 16. Consequently, VC_case2 216 is concurrently the charge pump output voltage as well as the VCO input voltage. Because voltage VC_case2 216 does not oscillate as significantly, VC_case2 216 reaches a very high value during POR sequence. As shown in FIG. 2, VC_case2 216 is at or near its maximum at time 204. Consequently, PLL_Out_case2 218 reaches a high frequency value, and as shown, is also at or near its maximum at time 204. The high frequency value attained by PLL_Out_case2 218 exceeds a maximum allowable input frequency for divider 18.

The phase-locked loop circuit 10 cannot achieve lock in scenario 2 since the maximum input frequency of divider 18 is exceeded. As indicated by PLL_Out_case2, PLL 10 does not lock from before time 204 until after time 206. Accordingly, a need exists for phase-locked loop circuits which are configured to reduce lock failures.

Figure 3:
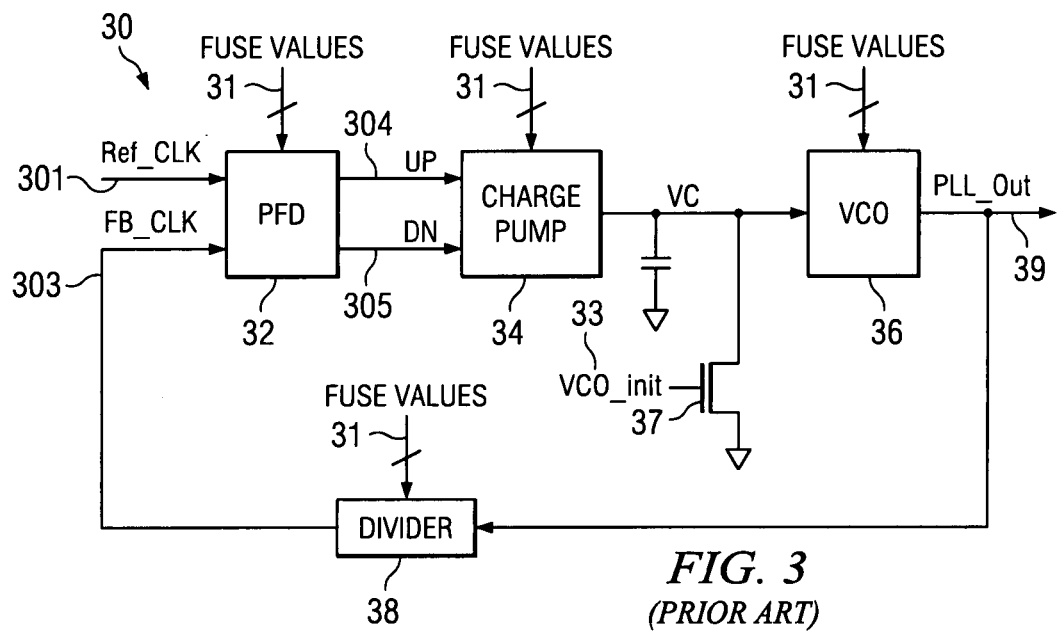
FIG. 3 is a block diagram of a prior art phase-locked loop circuit which is configured to be initialized.

FIG. 3 is a block diagram of a prior art phase-locked loop circuit which is configured to be initialized. In particular, phase-locked loop (PLL) 30 is adapted to receive an initialization signal, VCO_Init 33. PLL 30 is configured to initialize when initialization signal VCO_Init 33 is asserted. In PLL 30 of FIG. 3, initialization occurs during a power on reset sequence, and initialization includes grounding an input node to voltage-controlled oscillator 36. As a result of grounding the input node to voltage-controlled oscillator 36, voltage-controlled oscillator output signal, PLL_Out 39, is at or near a minimum frequency during the power on reset sequence. Consequently, PLL 30 is configured to avoid lock failures caused by exceeding an input frequency of divider 38 at start-up. A detailed description of PLL 30 configuration follows.

Phase-locked loop (PLL) 30 includes phase-frequency detector (PFD) 32, charge pump 34, voltage-controlled oscillator (VCO) 36, divider 38, and initialization circuitry 37. PFD 32 compares phase and frequency of reference signal, Ref_CLK 301, with phase and frequency of feedback signal, FB_CLK 303. From these comparisons, PFD 32 generates difference signals. These difference signals are positive current source UP 304 and negative current source DN 305. UP 304 and DN 305 are provided to charge pump 34, and charge pump 34 generates a charge proportional to these difference signals. This generated charge, labeled VC, is input to VCO 36.

VCO 36 generates periodic signal PLL_Out 39 according to input voltage VC. In PLL 30 of FIG. 3, the periodic signal, PLL_Out 39, is not only the output of VCO 36 but also the output of PLL 30. Further, PLL_Out 39 may be interchangeably referred to as either a frequency response or a frequency output. Feedback frequency divider 38 divides signal PLL_Out 39 and provides resultant feedback signal FB_CLK 303 to the feedback clock input of phase-frequency detector (PFD) 32.

PLL 30 includes initialization circuitry configured to initialize PLL 30 when an initialization signal is asserted. Such initialization circuitry includes circuitry 37 connected to node 35, which is arranged between charge pump 34 and voltage-controlled oscillator 36. Charge pump 34 provides input to voltage-controlled oscillator 36. Node 35 is common to both the output of charge pump 34 and the input to voltage-controlled oscillator 36. Therefore, the voltage is substantially the same at node 35, the input to voltage-controlled oscillator 36, and the output of charge pump 34. Node 35, the input to voltage-controlled oscillator 36, and the output of charge pump 34 are all electrically common.

Circuitry 37 is configured to pull the voltage at node 35 to ground when an initialization signal VCO_Init 33 is asserted. Of particular interest is pulling to ground the input voltage to voltage-controlled oscillator 36, as described below. Therefore, circuitry 37 is inserted between ground and node 35, where node 35 is electrically common to charge pump output and VCO input. Circuitry 37 is configured such that node 35 can be pulled to ground with the assertion of an initialization signal, VCO_Init 33.

As shown in FIG. 3, initialization circuitry 37 is a FET, and FET 37 is arranged between node 35 and ground. FET 37 is activated by initialization signal VCO_Init 33. When VCO_Init 33 is asserted, FET 37 is active, allowing current to flow from node 35 to ground. Consequently, the voltage at node 35 is pulled to ground when VCO_Init is asserted. It follows that as the voltage at node 35 is pulled to ground, the VCO input voltage approaches zero volts. VCO 36 generates output frequency PLL_Out 39 according to the VCO input voltage. Thus, PLL_Out 39 approaches its minimum frequency while the VCO input frequency approaches zero volts. Therefore, while VCO_Init 33 is asserted, output frequency PLL_Out 39 approaches and/or achieves its minimum output frequency.

Although in the illustrated embodiment field effect transistor (FET) 37 is inserted between input node 35 and ground, other circuitry providing similar functionality may be used in lieu of FET 37. Further, if other circuitry may achieve similar functionality without insertion between node 35 and ground, placement of the other circuitry is irrelevant. Furthermore, other means besides circuitry may be used if such other means provides similar functionality.

Scenario 2, described above in conjunction with FIG. 2, is a scenario in which lock is not achieved due to a VCO output frequency which exceeds the maximum input frequency of a divider. As discussed, it may be difficult to design a high-frequency-response PLL circuit having a divider with a maximum allowable input frequency which exceeds a maximum achievable output frequency of a corresponding VCO. In contrast, a PLL circuit having a divider with a maximum allowable input frequency that exceeds a minimum or near-minimum achievable output frequency of a corresponding VCO may be easily designed.

Consequently, when PLL_Out 39 is at or near the minimum achievable output frequency of VCO 36, a maximum input frequency for divider 38 is not exceeded. Thus, through use of circuitry and an initialization signal, such as FET 37 and VCO_Init 33, exceeding maximum divider input frequency may be eliminated as a cause of PLL lock failure. Therefore, PLL 30, including circuitry 37 and signal 33, may consistently lock after VCO_Init 33 is unasserted, as described below.

Figure 4:
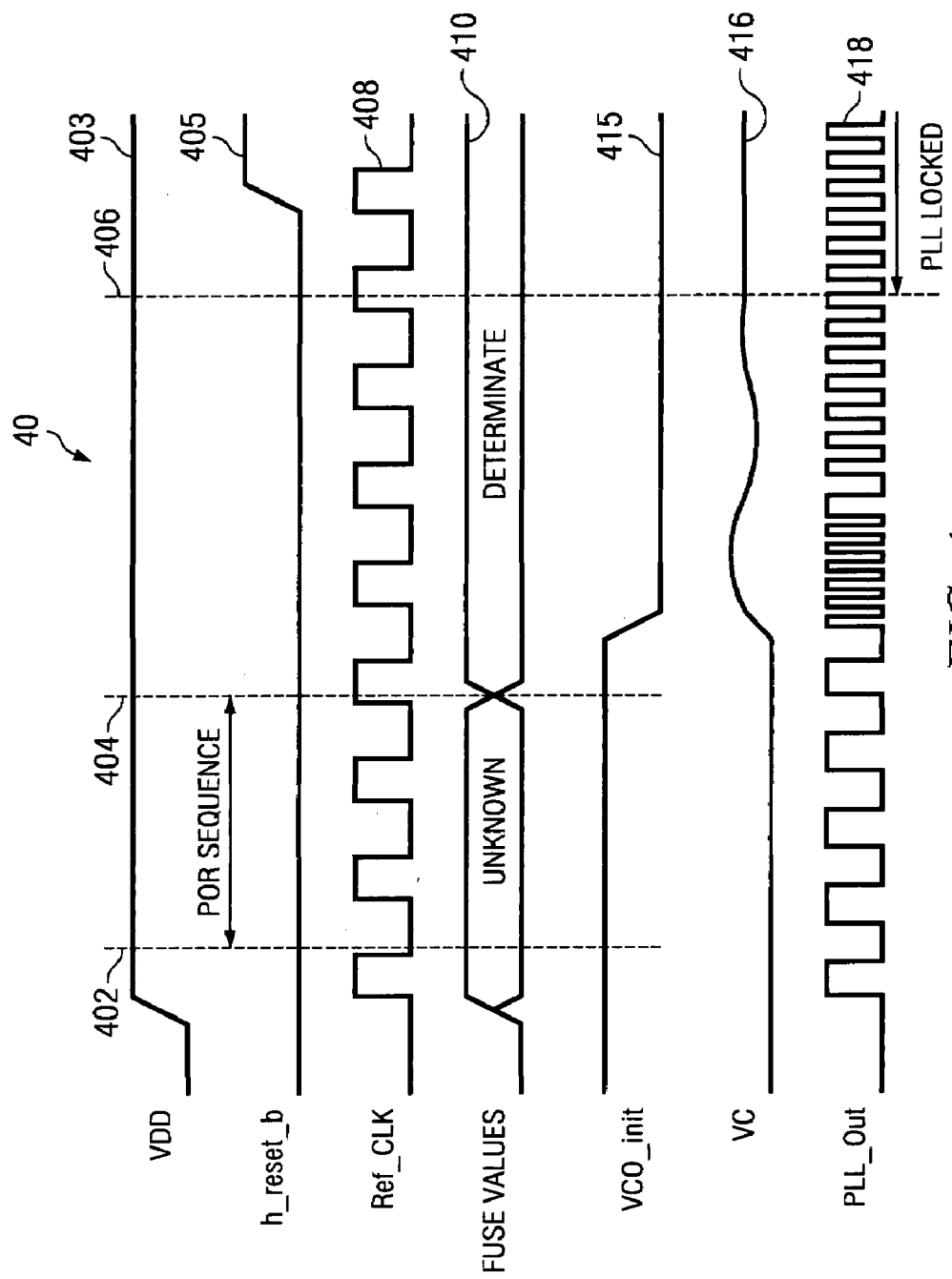
FIG. 4 is a timing diagram for a phase-locked loop circuit having initialization circuitry such as shown in FIG. 3.

FIG. 4 is a timing diagram 40 for a PLL circuit having initialization circuitry, such as PLL 30 shown in FIG. 3. In particular, timing diagram 40 illustrates a power on reset (POR) sequence where an initialization signal is asserted throughout the POR sequence. Timing diagram 40 illustrates a number of PLL signals and values over a period of time. The time period includes power on reset (POR) sequence having beginning time 402 and ending time 404. The signals and values illustrated by the timing diagram include: power supply voltage VDD 403; hardware reset signal h_reset_b 405; reference clock signal Ref_CLK 408; Fuse Values 410; initialization signal VCO_init 415; VCO input voltage VC 416; and VCO frequency response PLL_Out 418.

The phase-locked loop power supply voltage VDD 403 remains high throughout the POR sequence, and the hardware reset signal h_reset_b 405 remains low throughout the POR sequence. The power on reset (POR) sequence has beginning time 402 and ending time 404. The reference clock signal Ref_CLK 408 maintains substantially constant amplitude and substantially constant phase from before time 402 until after time 406. Fuse values 410 are unknown throughout the POR sequence. However, fuse values 410 become known, or determinate, some time after POR ending time 404.

Initialization signal VCO_Init 415 is high throughout the POR sequence. As shown in FIG. 3, VCO_Init 33 gates FET 37. Thus, when VCO_Init 33 is high, FET 37 is active and effectively pulls to ground the voltage at node 35, the input to VCO 36. Similarly, as shown in FIG. 4, VCO input voltage VC 416 is low while signal VCO_Init 415 is high. Thus, VCO input voltage VC 416 is low throughout the POR sequence. Voltage-controlled oscillator frequency, PLL_Out 418, is a function of voltage-controlled oscillator input voltage, VC 416. Thus, while voltage VC 416 is low, frequency PLL_Out 418 is limited to low frequencies. Consequently, throughout the POR sequence while VCO_Init 415 is high, voltage VC 416 is low and PLL_Out 418 is limited to low frequencies.

While PLL_Out 418 is limited to low frequencies, PLL_Out 418 will not exceed a divider's maximum input frequency. Because VC 416 is not allowed to go high during the POR sequence, PLL_Out 418 will not go to a high frequency during the POR sequence. Because PLL_Out 418 will not go to a high frequency during the POR sequence, PLL_Out 418 will not exceed a divider's maximum input frequency at start-up. As a result, PLL 30 will not fail to lock due to exceeding the maximum input frequency for divider 38. Therefore, as illustrated by PLL_Out 418 in FIG. 4, PLL 30 can achieve lock near time 406. Near time 406, the PLL output signal PLL_Out 418 achieves substantially constant amplitude and/or substantially constant phase and is thus referred to as "locked".

As shown in FIGS. 3 and 4 and as described above, grounding an input node of a voltage controlled oscillator during a power on reset sequence effectively prevents PLL lock failures which result from exceeding maximum divider input frequencies. Grounding the input node of a voltage-controlled oscillator was accomplished by adding circuitry to the input node of the voltage-controlled oscillator. Because an input node of a voltage-controlled oscillator can be very sensitive to noise, it is desirable to initialize a PLL circuit without adding initialization circuitry to an input node of a voltage-controlled oscillator.

Figure 5:
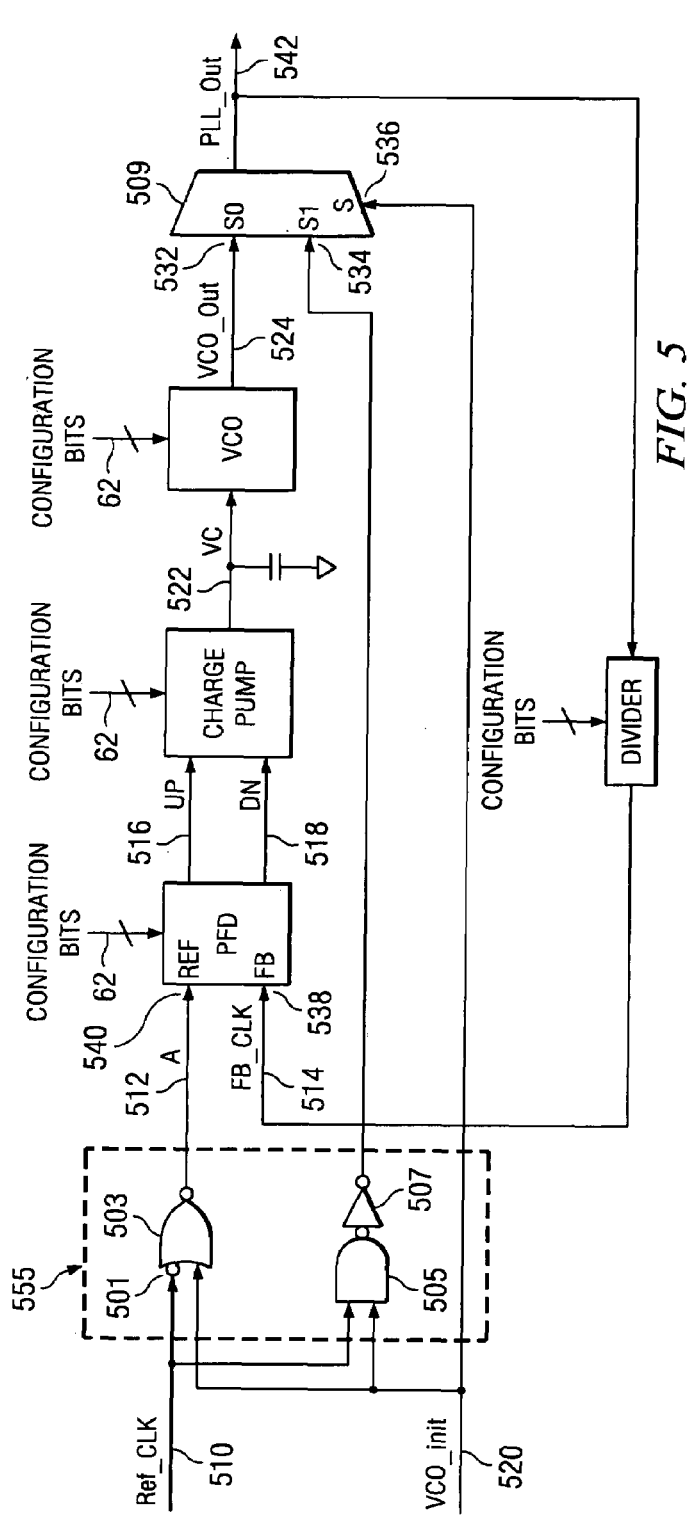
FIG. 5 is a block diagram of one embodiment of a phase-locked loop circuit configured to be initialized according to the present invention, having no initialization circuitry on an input node of a voltage-controlled oscillator.

FIG. 5 is a block diagram of one embodiment of a phase-locked loop circuit configured to be initialized, yet having no initialization circuitry on an input node of a voltage-controlled oscillator, according to the present invention. Phase-locked loop (PLL) 50 is adapted to receive an initialization signal, VCO_Init 520, and to initialize when initialization signal VCO_Init 520 is asserted. Initialization signal VCO_Init 520 can be asserted during a power on reset sequence. PLL 50 is configured to include initialization circuitry, where the initialization circuitry is adapted to initialize PLL 50 during the power on reset sequence; however such initialization circuitry is not connected directly to an input of the VCO.

As shown in FIG. 5, PLL 50 includes phase-frequency detector (PFD) 502, charge pump 504, voltage controlled oscillator (VCO) 506, multiplexer (MUX) 509, Divider 508, and input circuitry 555. In the embodiment of FIG. 5, input circuitry 555 comprises inverter 501, NOR gate 503, NAND gate 505 and inverter 507. PFD 502 compares phases and frequencies of signals provided to reference input 540 and feedback input 538. From these comparisons, PFD 502 generates difference signals. These difference signals are positive current source, UP 516, and negative current source, DN 518. Current sources UP 516 and DN 518 are provided to charge pump 504. Charge pump 504 generates a charge proportional to the difference signals, current sources UP 516 and DN 518. The charge generated by charge pump 504, VC 522, is input to VCO 506. VCO 506 generates periodic signal VCO_Out 524 according to input voltage VC 522. Feedback frequency divider 508 provides a feedback signal, FB_CLK 514, to the feedback input 538 of PFD 502. Thus, PLL 50 displays some of the functionality of the above-described phase-locked loop circuits.

As shown in FIG. 5, phase-locked loop circuit PLL 50 is further configured to improve initialization. In particular, PLL 50 is configured to include initialization circuitry which controls the phase-locked loop output as well as the phase-locked loop inputs. Such initialization circuitry can include input circuitry 555 and multiplexer (MUX) 509. Although specific circuit elements are shown, it is understood that any and all circuitry which may be configured to yield similar results may be substituted.

Improved initialization can be realized using the embodiment of PLL circuit 50, including initialization circuitry, shown in FIG. 5. As shown, reference clock input signal, Ref_CLK 510, is inverted by inverter 501. The inverted reference clock signal is input to NOR gate 503. The initialization signal VCO_Init 520 is also input to NOR gate 503. The output from NOR gate 503, output signal A 512, is provided to reference input 540 of PFD 502. The truth table for NOR gate 503 is shown below as TABLE 1. PFD feedback input 538 receives feedback signal FB_CLK 514, which will be described in further detail below. PFD 502 compares phase and/or frequency of signals A 512 and FB_CLK 514.

The above-referenced truth table for NOR gate 503 is:

TABLE 1

| INPUT VCO_Init | 520 | 0 | 0 | 1 | 1 |
| INPUT Ref_CLK | 510 | 0 | 1 | 0 | 1 |
| OUTPUT SIGNAL A | 512 | 0 | 1 | 0 | 0 |

PFD 502 generates two signals from the comparison of signal A 512 and signal FB_CLK 514, UP 516 and DN 518. Current source signals UP 516 and DN 518 are provided as inputs to charge pump 504. From current source signals UP 516 and DN 518, charge pump 504 generates a voltage VC 522. Charge pump 504 provides voltage VC 522 as an input to voltage controlled oscillator (VCO) 506. VCO 506 generates periodic signal VCO_Out 524, which is proportional to input voltage VC 522. The output frequency response VCO_Out 524 is provided as an input to multiplexer 509. In particular, VCO_Out 524 is provided to input S0 532 of multiplexer 509.

Input S1 534 of multiplexer 509 is also provided with an input, as follows. Reference clock input signal Ref_CLK 510 and initialization signal VCO_init 520 are both input to NAND 505. NAND 505 provides input to inverter 507, which in turn provides input to input S1 534 of multiplexer 509. Thus, the output of NAND 505 is inverted prior to being input to input S1 534 of multiplexer 509. The truth table for NAND 505 and inverter 507 is detailed in TABLE 2 below.

The above-referenced truth table for inverter 507 and NAND 505 is:

TABLE 2

| INPUT VCO_Init | 0 | 0 | 1 | 1 |
| --- | --- | --- | --- | --- |
| INPUT Ref_CLK | 0 | 1 | 0 | 1 |
| OUTPUT S1 | 0 | 0 | 0 | 1 |

Multiplexer 509 provides either input S0 532 or input S1 534 to multiplexer output PLL_Out 542. Multiplexer select input 536 determines which input, S0 532 or S1 534, is routed to output PLL_Out 542. When select input 536 is low, input S0 532 is selected as PLL_Out 542. However, when select input 536 is high, input S1 534 is selected as PLL_Out 542. In the embodiment shown in FIG. 5, select input 536 is coupled to VCO_init 520. Therefore, PLL_Out 542 is S0 532, or VCO_Out 524, when VCO_Init 520 is low. When VCO_Init 520 is high, PLL_Out 542 is S1 534, or the inverted output of NAND 505. In either case, output PLL_Out 542 is provided to divider 508, and divider 508 provides input to PFD feedback input 538. Therefore, since VCO_Init 520 determines PLL_Out 542, VCO_Init 520 determines the feedback input 538 to PFD 502.

VCO_Init 520 also determines the reference input 540 to PFD 502. During a power-on-reset (POR) sequence, VCO_Init 520 is asserted or high. When VCO_Init 520 is high, PFD reference input 540 is pulled low. As shown in the illustrated embodiment, PFD reference input 540 receives input from NOR gate 503. NOR gate 503 receives as inputs initialization signal VCO_Init 520 and inverted reference signal Ref_CLK 510. According to the truth table for NOR gate 503 shown in TABLE 1, NOR output signal A 512 is low when VCO_Init 520 is high. Therefore, PFD reference input 540 is held low while VCO_Init 520 is high. However, when VCO_Init is low, NOR output signal A 512 is substantially equivalent to Ref_CLK 510. Therefore, PFD reference input 540 receives as input Ref_CLK 510 while VCO_Init is low. Ref_CLK 510 simply passes through inverter 501 and NOR 503 when VCO_Init is low.

VCO_Init 520 also determines the feedback input 538 to PFD 502. While VCO_Init 520 is high, PFD feedback input 538 receives a divided reference clock signal Ref_CLK 510. As described previously, input S1 534 of multiplexer 509 receives the inverted output of NAND 505. Inputs to NAND 505 include Ref_CLK 510 and VCO_init 520. According to the truth table shown in TABLE 2, when initialization signal VCO_Init 520 is high, the inverted output of NAND 505 is reference signal Ref_CLK 510. As noted above, VCO_Init 520 gates MUX 509, selecting input S0 as output when VCO_Init 520 is low and selecting input S1 as output when VCO_Init 520 is high. Therefore, when VCO_Init 520 is high, multiplexer output PLL_Out 542 is reference signal Ref_CLK 510. Output PLL_Out 542 is passed through divider 508 and fed back to PFD feedback input 538 as feedback clock signal FB_CLK 514. Thus, while VCO_Init 520 is high, PFD feedback input 538 receives a divided reference signal Ref_CLK 510 as FB_CLK 514.

However, as noted above, reference signal Ref_CLK 510 simply passes through inverter 501 and NOR 503 when VCO_Init 520 is low. Thus, while VCO_Init 520 is low, Ref_CLK 510 is output from NOR 503 and presented as input to PFD reference input 540. Further, when VCO_Init 520 is low, multiplexer 509 outputs S0 532. As described above, VCO_Out 524 is provided as input to input S0 532 of multiplexer 509. Therefore, when VCO_Init 520 is low, PLL_Out 542 is VCO_Out 524 and Ref_CLK 510 is input to PFD reference input 540. Consequently, while VCO_Init 520 is low, PLL 50 operates normally. However, when VCO_Init 520 is high, PLL 50 initializes.

PLL 50 can be initialized during a power-on-reset (POR) sequence. During the POR sequence, PLL 50 may be configured to a steady state which is different from any state achieved during actual operation of PLL 50. Such steady state configuration may be facilitated by using values read into configuration bits 62. As shown in FIG. 5, configuration bits 62 may be used to configure PLL components, such as PFD 502, charge pump 504, VCO 506, and divider 508. As examples, changing the frequency of the PLL output may be desired, or changing the frequency of the reference signal input may be desired. Such changes may be facilitated by changing configuration bit values, described more fully in reference to FIG. 7 below.

PLL 50 is initialized to a state from which PLL lock is more readily attained during the POR sequence. In particular, VC 522, the output of charge pump 504, is attenuated during POR. Thus, free oscillation of VCO 506 is prevented. The functionality of the embodiment illustrated in FIG. 5 may be more easily understood by examination of timing diagram 60, shown in FIG. 6 and described below.

Figure 6:
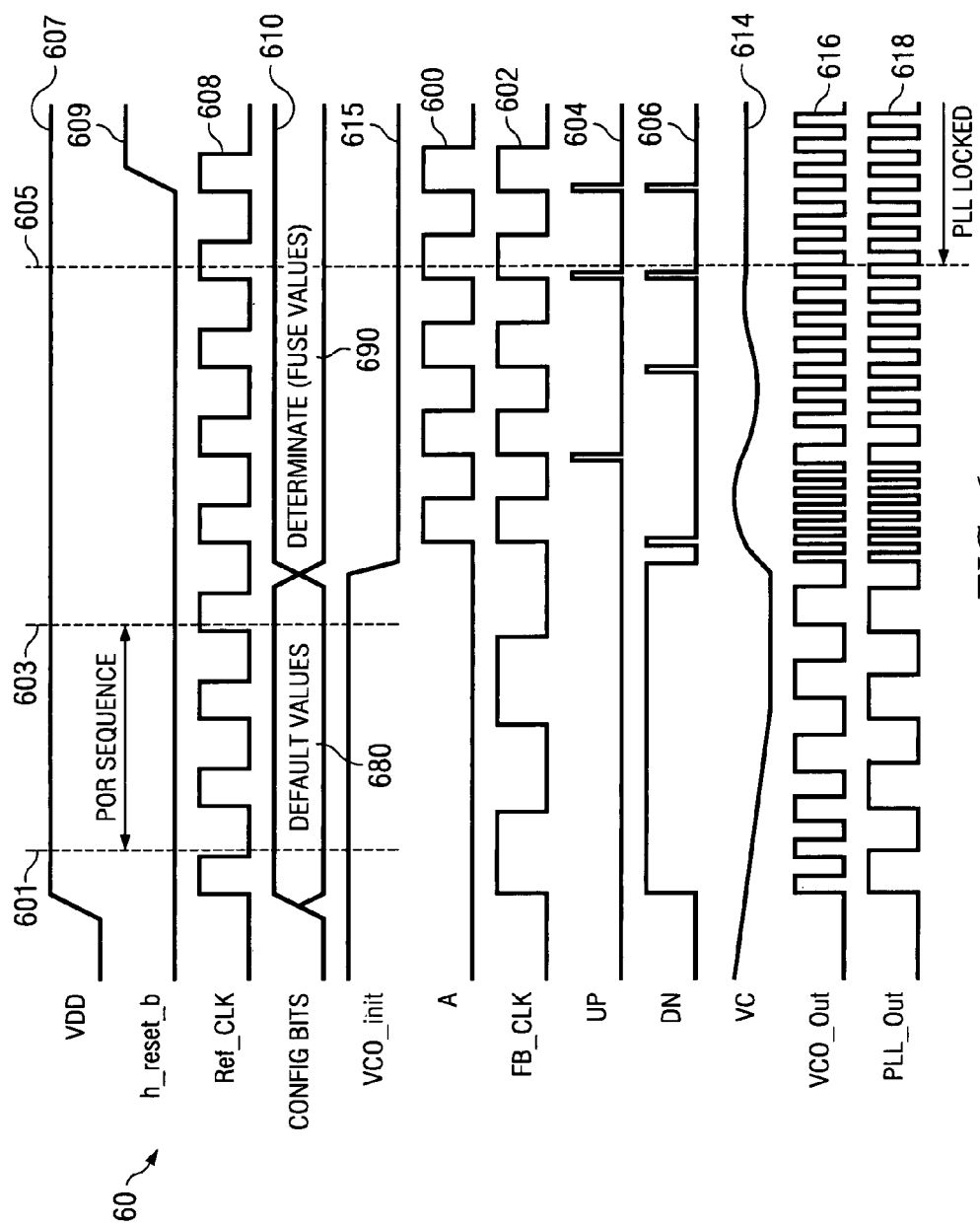
FIG. 6 is a timing diagram for a phase-locked loop circuit according to the present invention, such as the embodiment shown in FIG. 5.

FIG. 6 is a timing diagram 60 for a PLL circuit having initialization circuitry such as PLL 50 shown in FIG. 5. In particular, timing diagram 60 illustrates a power on reset (POR) sequence where an initialization signal is asserted throughout the POR sequence. Timing diagram 60 illustrates a number of PLL signals and values over a period of time. The time period includes power on reset (POR) sequence having beginning time 601 and ending time 603. The signals and values illustrated by the timing diagram include: power supply voltage VDD 607; hardware reset signal h_reset_b 609; reference clock signal Ref_CLK 608; Configuration bits 610; initialization signal VCO_init 615; NOR output signal A 600; FB_CLK 602; UP 604; DN 606; VCO input voltage VC 614; VCO frequency response VCO_Out 616; and PLL frequency response 618.

The phase-locked loop power supply voltage VDD 607 remains high throughout the POR sequence, and the hardware reset signal h_reset_b 609 remains low throughout the POR sequence. The power on reset (POR) sequence has beginning time 601 and ending time 603. During this sequence, initialization signal VCO_Init 615 is high. The reference clock signal Ref_CLK 608 maintains substantially constant amplitude and substantially constant phase from before time 601 until after time 605. Configuration bits 610 are set to default values throughout the POR sequence. However, configuration bits 610 are determinate after POR ending time 603, substantially near the time VCO_Init 615 goes low.

Initialization signal VCO_Init 615 is high throughout the POR sequence. As shown in FIG. 5 and as described above, VCO_Init 615 gates PLL inputs and PLL output. In particular, when VCO_Init 615 is high, signal A 600 is pulled low. Signal A 600 represents the signal provided to PFD reference input 540. Also, when VCO_Init 615 is high, multiplexer output PLL_Out 618 is substantially equivalent to reference signal Ref_CLK 608. Therefore, during the POR sequence, the signal received at PFD feedback input 538 is frequency-divided Ref_CLK 608, represented by signal FB_CLK 602. PFD 502 compares signals A 600 and FB_CLK 602. Upon comparison of signals A 600 and FB_CLK 602 during the POR sequence, PFD 502 outputs a high DN signal 606, and a low UP signal 604. PFD 502 provides input to charge pump 504. Thus, charge pump 504 receives as inputs a high DN signal 606, and a low UP signal 604.

Charge pump 504 generates a charge, voltage VC 614, from the current sources UP 604 and DN 606. When charge pump 504 receives a high DN signal 606 and a low UP signal 604, charge pump 504 outputs an attenuated voltage VC 614, as shown. Voltage VC 614 approaches, and may reach, ground, i.e., zero volts. Voltage-controlled oscillator 506 receives input from charge pump 504. Since charge pump 504 provides an attenuated voltage VC 614 to VCO 506, free oscillation of VCO 506 is prevented during POR sequence. When attenuated voltage VC 614 is input to voltage-controlled oscillator 506, the frequency of output signal VCO_Out 616 decreases proportionally, as shown.

VCO_Out 616 approaches a minimum frequency while VCO_Init 615 is high. Because VC 614 is not allowed to go high during the POR sequence, VCO_Out 616 will not go to a high frequency during the POR sequence. Since VCO_Out 616 is limited to low frequencies, VCO_Out 616 will not exceed a maximum input frequency for divider 508. As a result, PLL 50 will not fail to lock due to exceeding the maximum input frequency for divider 508. Thus, as shown near time 605, PLL 50 may achieve lock. Near time 605, the PLL output signal PLL_Out 618 exhibits substantially constant amplitude and/or substantially constant phase and is thus referred to as "locked".

At some time after time 603, VCO_Init 615 goes low. As noted, configuration bits 610 are determinate when VCO_Init 615 is low. Also, multiplexer 509 output PLL_Out 618 is substantially equivalent to VCO_Out 616 when VCO_Init 615 is low. In addition, signal A 600, which provides input to the PFD feedback input 538, is substantially equivalent to Ref_CLK 608 when VCO_Init 615 is low. Thus, PLL 50 functions normally when VCO_Init 615 is low. During the POR sequence, VCO_Out 616 is pulled to a low frequency. Therefore, when PLL 50 begins to operate normally following the POR sequence, VCO_Out 616 is at a low frequency.

PLL circuits may more quickly achieve lock when VCO_Out is initially at a low frequency. Thus, despite the time involved to initiate a PLL with the POR sequence described, such a PLL may achieve lock more quickly than a PLL which does not use a POR sequence. Further, the described POR sequence can eliminate lock failures due to exceeding the maximum divider input frequency. Furthermore, because the status of the PLL circuit at each node may be known following the POR sequence, the time required for the PLL to achieve lock may be known, calculable, or at least more easily estimated. Thus, PLL applications having critical timing requirements may be improved with this PLL circuit configuration and initialization method.

During the described POR sequence, default values 680 may be read into configuration bits 610. Default values 680 may be set, for example, during manufacture of PLL 50. Default values 680 may be optimized for initialization of PLL 50. As shown in FIG. 6, configuration bits 610 have default values 680 during the POR sequence while VCO_Init 615 is high. However, configuration bits 610 have fuse values 690, or values held in non-volatile memory devices, when initialization signal, VCO_Init 615, is low.

Figure 7:
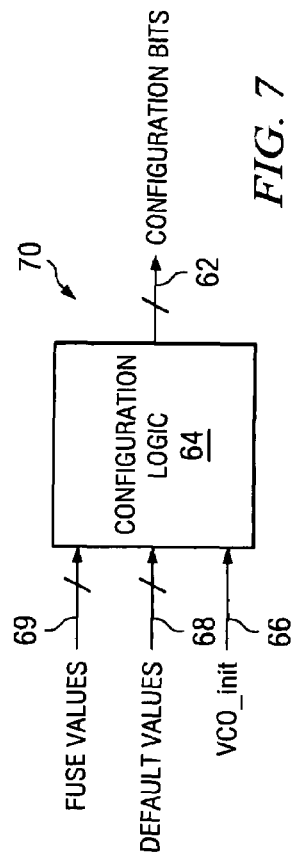
FIG. 7 is a block diagram of one embodiment of configuration logic according to the present invention.

FIG. 7 is a block diagram 70 of an embodiment of configuration logic 64 that can be used to generate configuration bits 62 in FIG. 5. For a variety of applications, configuration bits 62 may be determined via some configuration logic 64, including other configuration logic not described. The input to configuration logic 64 may be default values 68; initialization signal VCO_Init 66; and determinate values, where determinate values include fuse values 69 and values held in non-volatile memory devices. Fuse values 69 may be, for example, E-fuses or Laser fuses. Determinate values may be loaded during the POR sequence but are generally unknown until the POR sequence is completed.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A phase-locked loop circuit (PLL) comprising:
a phase-frequency detector;
a charge pump coupled to the phase-frequency detector;
a voltage-controlled oscillator coupled to the charge pump;
configuration circuitry for initializing the PLL, wherein the configuration circuitry is adapted to control a reference-signal to the phase-frequency detector and a feedback-signal to the phase-frequency detector; and
a first circuitry operable to provide a first output signal, wherein said first output signal is low when an initialization signal is high and wherein said first output signal is input to a reference-signal input of the phase-frequency detector.

2. The PLL circuit of claim 1, further comprising a second circuitry operable to provide a second output signal, wherein the second output signal is substantially equivalent to a reference-clock signal when the initialization signal is high.

3. The PLL circuit of claim 2, further comprising a third circuitry operable to provide a third output signal, wherein the third output signal is substantially equivalent to an oscillation signal from the voltage-controlled oscillator when the initialization signal is low, and wherein the third output signal is substantially equivalent to the second output signal when the initialization signal is high.

4. The PLL circuit of claim 3, further comprising a divider, wherein the divider is configured to receive the third output signal, and wherein the divider is further configured to provide a frequency-divided third output to a feedback-signal input of the phase-frequency detector.

5. The PLL circuit of claim 4, wherein the phase-frequency detector, the charge pump, the voltage-controlled oscillator, and the divider are adapted to receive configuration bit values.

6. The PLL circuit of claim 5, further comprising configuration logic adapted to provide default configuration bit values when said initialization signal is high.

7. A method of initializing a phase-locked loop (PLL) circuit comprising:
asserting an initialization signal coupled to a phase-locked loop circuit;
controlling a set of inputs to the phase-locked loop circuit based on the initialization signal; and
attenuating an input voltage to a voltage-controlled oscillator based on the initialization signal,
wherein the set of inputs comprises a reference-signal input, and wherein said controlling comprises holding the reference-signal input low when the initialization signal is asserted.

8. The method as recited in claim 7, wherein the set of inputs further comprises a feedback-signal input and a divider input, and wherein said controlling further comprises:
providing a phase-locked loop output signal from a voltage-controlled oscillator when the initialization signal is unasserted;
receiving the phase-locked loop output signal at an input to a divider;
providing a feedback signal from a divider; and
receiving the feedback signal at the feedback-signal input.

9. The method as recited in claim 8, wherein the set of inputs further comprises a feedback-signal input and a divider input, and wherein said controlling further comprises:
providing a signal not from a voltage-controlled oscillator when the initialization signal is asserted;
receiving said signal at an input to a divider;
providing a feedback signal from a divider; and
receiving the feedback signal at the feedback-signal input.

10. The method as recited in claim 9, wherein the signal is a reference signal when the initialization signal is asserted.

11. The method as recited in claim 10, further comprising:
controlling a first initialization circuit;
coupling a first input of a feedback circuit to an output of the voltage-controlled oscillator;
coupling a second input of the feedback circuit to an output of the first initialization circuit, wherein the feedback signal originates from an output of the feedback circuit.

12. The method of claim 11, further comprising:
coupling the initialization signal to the feedback circuit; and
controlling the feedback circuit such that an output of the feedback-circuitry is substantially equivalent to the output of the voltage-controlled oscillator when the initialization signal is unasserted.

13. The method of claim 12, further comprising controlling the feedback circuit such that an output of the feedback-circuitry is substantially equivalent to a reference signal when the initialization signal is asserted.

14. The method of claim 13, wherein the set of inputs further comprises a reference-signal input, the method further comprising controlling a second initialization circuit, wherein an output of the second initialization circuit is input to the reference-signal input.

15. The method of claim 14, further comprising
providing the initialization signal as input to the second initialization circuit;
and controlling the output of the second initialization circuit such that said output is low when the initialization signal is asserted.

16. The method as recited in claim 7, further comprising providing default values to PLL configuration bits when the initialization signal is asserted.

17. A phase-locked loop (PLL) circuit comprising:
a first initialization circuit configured to gate a reference-signal input of a phase-freguency detector, wherein an initialization signal controls the first initialization circuit; and a feedback circuit inserted into a feedback loop, wherein the feedback loop originates at an output of a voltage-controlled oscillator and terminates at a feedback-signal input to the phase-freguency detector, wherein the feedback circuit includes a first input, a second input, and an output, wherein the first input is coupled to the output of the voltage-controlled oscillator, and wherein the second input is coupled to an output of a second initialization circuit.

18. The PLL circuit of claim 17, wherein the initialization signal is coupled to a select input of the feedback circuit, wherein the output of the feedback circuit is substantially equivalent to the output of the voltage-controlled oscillator when the initialization signal is unasserted, and wherein the output of the feedback circuit is substantially equivalent to the output of the second initialization circuit when the initialization signal is asserted.

19. The PLL circuit of claim 18, further comprising a reference signal, wherein the output of the second initialization circuit is substantially equivalent to the reference signal when the initialization signal is asserted.

20. The PLL circuit of claim 19, wherein the output of the first initialization circuit is low when the initialization signal is asserted.

21. The PLL circuit of claim 20, wherein the output of the first initialization circuit is substantially equivalent to the reference signal when the initialization signal is unasserted.

22. The PLL circuit of claim 21, further comprising configuration bits, and wherein default values are restored into the configuration bits when the initialization signal is asserted.

23. A phase-locked loop circuit (PLL) comprising:
a phase-frequency detector for receiving a reference-signal and a feedback-signal, and for outputting error signals based on phase and frequency differences between the reference signal and the feedback signal;
a charge pump connected to the phase-frequency detector for receiving error signals from the phase-frequency detector and for outputting a charge pump signal;
a voltage-controlled oscillator connected to the charge pump for receiving the charge pump signal and for outputting a corresponding oscillation signal;
circuitry operable to perform a logic NOR function for receiving an inverted reference-clock signal and an initialization signal, and for providing a NOR output signal, wherein said NOR output signal is low when the initialization signal is high and wherein said NOR output signal is provided to a reference-signal input of the phase-frequency detector;
circuitry operable to perform a logic NAND function for receiving a reference-clock signal and the initialization signal, and for providing a NAND output signal, wherein the inverted NAND output signal is substantially equivalent to the reference-clock signal when the initialization signal is high;

circuitry operable to perform a multiplexer function for receiving the initialization signal, the oscillation signal, and the inverted NAND output signal, wherein an output of the multiplexer is substantially equivalent to the oscillation signal when the initialization signal is low, and wherein an output of the multiplexer is substantially equivalent to the reference-clock signal when the initialization signal is high; and a divider for receiving the multiplexer's output, and for outputting a frequency-divided multiplexer output to a feedback-signal input of the phase-frequency detector.

24. The phase-locked loop circuit as recited in claim 23, wherein the phase-frequency detector, the charge pump, the voltage-controlled oscillator, and the divider are adapted to receive configuration bit values.

25. The phase-locked loop circuit as recited in claim 24, further comprising configuration logic adapted to provide default configuration bit values when said initialization signal is high.

* * * * *